(12) United States Patent
Lue et al.

(10) Patent No.: US 7,088,613 B2
(45) Date of Patent: Aug. 8, 2006

(54) METHOD FOR CONTROLLING CURRENT DURING READ AND PROGRAM OPERATIONS OF PROGRAMMABLE DIODE

(75) Inventors: Hang-Ting Lue, Hsinchu (TW); Ming-Hsiu Lee, Hsinchu (TW)

(73) Assignee: Macronix International Co., Ltd. (TW)

( * ) Notice: Subject to any disclaimer, the term of this patent is extended or adjusted under 35 U.S.C. 154(b) by 160 days.

(21) Appl. No.: 10/846,006

(22) Filed: May 14, 2004

(65) Prior Publication Data
US 2005/0254296 A1    Nov. 17, 2005

(51) Int. Cl.
*G11C 11/36* (2006.01)
(52) U.S. Cl. .................. 365/175; 365/105; 365/230.06
(58) Field of Classification Search ................ 365/174, 365/175, 177, 105, 243, 230.06, 230.08
See application file for complete search history.

(56) References Cited

U.S. PATENT DOCUMENTS

| | | | | |
|---|---|---|---|---|
| 5,018,108 A | * | 5/1991 | Maruyama | ............ 365/185.23 |
| 5,572,471 A | * | 11/1996 | Proebsting | .................. 365/200 |
| 5,963,472 A | * | 10/1999 | Inada et al. | ................. 365/175 |
| 6,034,882 A | | 3/2000 | Johnson et al. | |
| 6,434,053 B1 | * | 8/2002 | Fujiwara | ................. 365/185.28 |

OTHER PUBLICATIONS

C. de Graaf et al., "A Novel High-density Low-Cost Diode Programmable Read Only Memory," *IEDM Tech. Digest* (1996), pp. 189-192.
M. Crowley et al., "512Mb PROM with 8 Layers of Antifuse/Diode Cells," 2003 IEEE International Solid-State Circuits Conference, Session 16, Paper 16.4 (10 pages).

* cited by examiner

*Primary Examiner*—Gene N. Auduong
(74) *Attorney, Agent, or Firm*—Martine Penilla & Gencarella, LLP

(57) ABSTRACT

A method for controlling current fluctuations during read and program operations in a memory structure is provided. The method includes applying a first voltage to a first gate of a word line decoder transistor. The method further includes applying a second voltage to a second gate of a bit line decoder transistor such that the first voltage is greater than the second voltage. The method also includes maintaining the source voltage of the bit line decoder transistor at about zero.

14 Claims, 6 Drawing Sheets

METHOD FOR CONTROLLING CURRENT DURING READ AND PROGRAM OPERATIONS OF PROGRAMMABLE DIODE

BACKGROUND OF THE INVENTION

The present invention relates generally to memory devices and, more particularly, to a method for controlling current fluctuation during read and program operations.

Conventional memory architectures employ word lines and bit lines to access the memory cells defined by the memory architecture. Three dimensional (3D) memory structures include several memory layers that are stacked one on top of the other. FIG. 1 illustrates a 3 dimensional memory structure. The memory structure includes word lines 12 and bit lines 10. The word lines (WL) and the bit lines (BL) are connected to word line and bit line decoder transistors 14. The bit lines 10 are connected to programmable diodes 16. During read and program operations the decoder transistors 14 select the bit line and the read line corresponding to a memory cell to be accessed (not shown). In a 3D memory structure as shown in FIG. 1, the layer decoder transistors are employed in both the WL and the BL for the selection layers. Therefore, the equivalent circuit can be treated as two MOSFETs connected by a programmable diode 16 and a series resistor (not shown). Generally, the decoder transistors 14 act as switches. When the transistor is turned on, a high gate voltage ($V_G$) is applied so that the MOSFET will be in a low-resistance status. As a result, the MOSFET will act like a switch.

Generally, a read or program operation is carried out by applying constant high voltages to the selected WL and BL. However, the diode-current during the read operation varies exponentially with the voltage. Hence, a small device variation or the loading effect due to the series resistance of WL and BL may cause large variations in the current during the read operation. In such situations, the voltage required for the read operation must be increased to ensure that the current through all the programmable diodes are larger than a predetermined current required for the read operation. This may cause some of the diodes to undergo large stresses, due to the high current, during read and program operations. This stress can cause reliability problems as the programmable diode has a tendency to go into an un-programmed state where the diode acts as an open-circuit.

FIGS. 2 and 3 graphically illustrates the relatively large variations in current during read operations when there are small changes in voltage. FIG. 2 is a graph showing the overall current applied during read operations. The overall current is shown on the y-axis while the applied voltage is shown on the x-axis. As can be seen, there is a two orders of magnitude difference in the overall current due to loading effect and diode variation, as shown in region 22.

FIG. 3 is a graph further illustrating a condition where there is a large variation in diode current as a result of small fluctuations in voltage. In FIG. 3, the voltage during the read operation is represented on the x-axis and the current during the read operation is represented on the y-axis. In this case, the minimum required read current is indicated by line 32. According to FIG. 3, the voltage required for the minimum current is $V_R$. The choice of $V_R$ is to ensure that all diodes can be correctly read. However, in this case for the same $V_R$ value, the current required by some of the diodes during the read operation is illustrated by current values corresponding to lines 34 and 36 so that the current through the diodes during the read operation remains larger than a minimum required value. The current values corresponding to lines 34 and 36 are relatively high compared to the current value at line 32. As described above, the diodes with such high current values are likely to undergo large stress.

Similarly, the ON state characteristics of the programmable diode are strongly dependent on the current required for the program operation. Therefore, the current on the diodes during the program operation must be kept at a constant in order to prevent device-characteristic variation.

In the past a constant voltage has been applied to both the word line and the bit line during the read and program operations. However, this approach was not proven to be effective, as it did not address the issue of large current fluctuations in the diodes during read operations.

In light of the foregoing, there is a need to minimize fluctuations in current value during read and program operations.

SUMMARY OF THE INVENTION

Broadly speaking, the present invention enables a decoding scheme in which the bit line decoder functions as a current limiter.

In accordance with an aspect of the present invention, a method for controlling current fluctuations during read and program operations in a memory is provided. The method initiates with applying a first voltage to a first gate of a word line decoder transistor in a memory. The method includes applying a second voltage to a second gate of a bit line decoder transistor such that the first voltage is greater than the second voltage. The method includes maintaining the source voltage of the bit line decoder transistor at zero. The method further includes applying third voltage to the drain of the word line decoder transistor and read the current from this node. The read current is largely dependent on the second voltage. On the other hand, the read current is essentially independent of the third voltage and the device variations.

Yet another aspect of the invention involves a method for limiting the overall current during read and program operations. The method includes applying a voltage to a gate of the bit line decoder transistor. The method further includes applying a source voltage of about zero to the bit line decoder transistor such that a drain saturation current of the bit line decoder transistor during read and program operation is a constant.

The advantages of the present invention are numerous. First, the method prevents variations in current during read operation due to diode deviation and loading effect. Second, the existing systems may be used without incurring additional overhead associated with new circuitry or process. Third, the method controls the current so that the diodes do not undergo stress due to current fluctuations. Fourth, the invention can be easily integrated into a 3 dimensional (3D) memory.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments of the invention will now be described in detail with reference to the accompanying drawings.

In accordance with the present invention, a memory structure, having memory core cells, which incorporates a decoding scheme is provided. A memory cell of the memory structure is accessed at the intersection of a bit line and a word line. A read or program operation is generally conducted by applying two different voltages to the bit line and the word line corresponding to the memory cells to be accessed.

Figure 1:
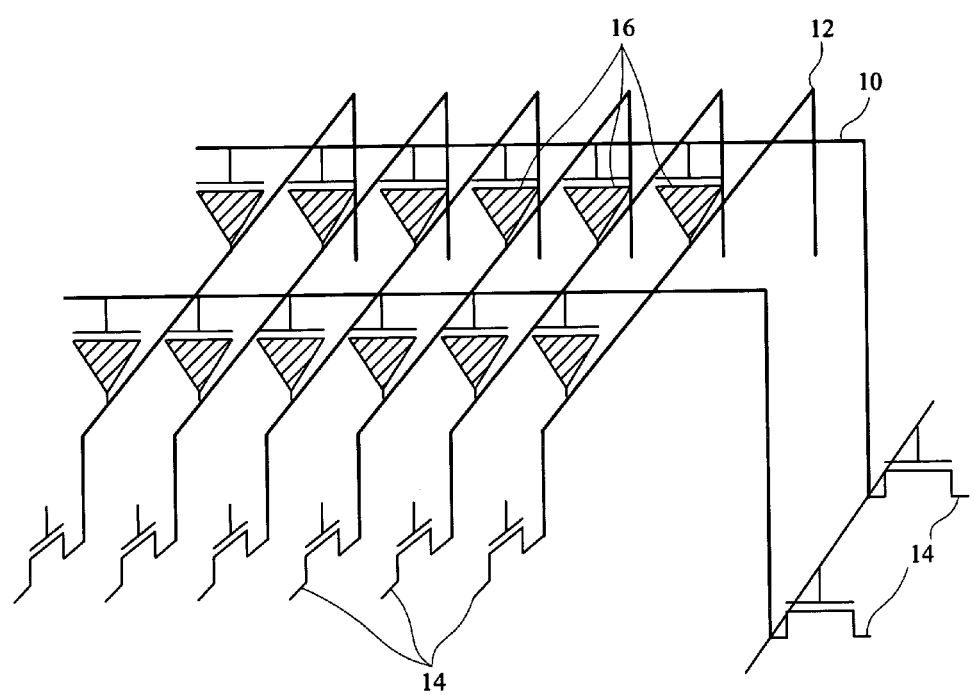
FIG. 1 illustrates a schematic of the 3D conventional memory wherein the word lines and the bit lines are connected to decoders.
Figure 2:
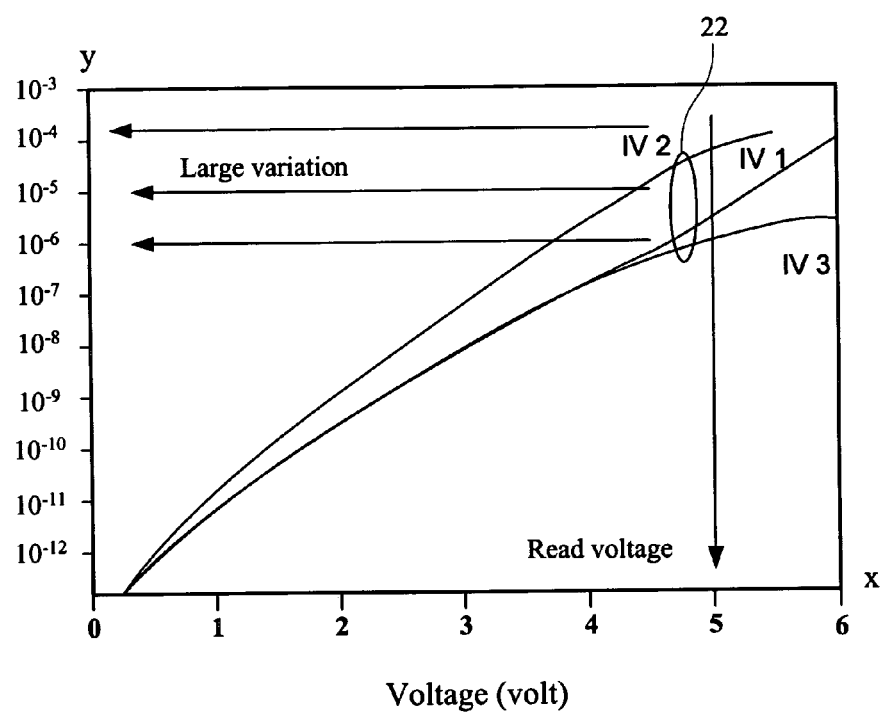
FIG. 2 is a graph illustrating large variations in current when there is a small fluctuation in voltage.
Figure 3:
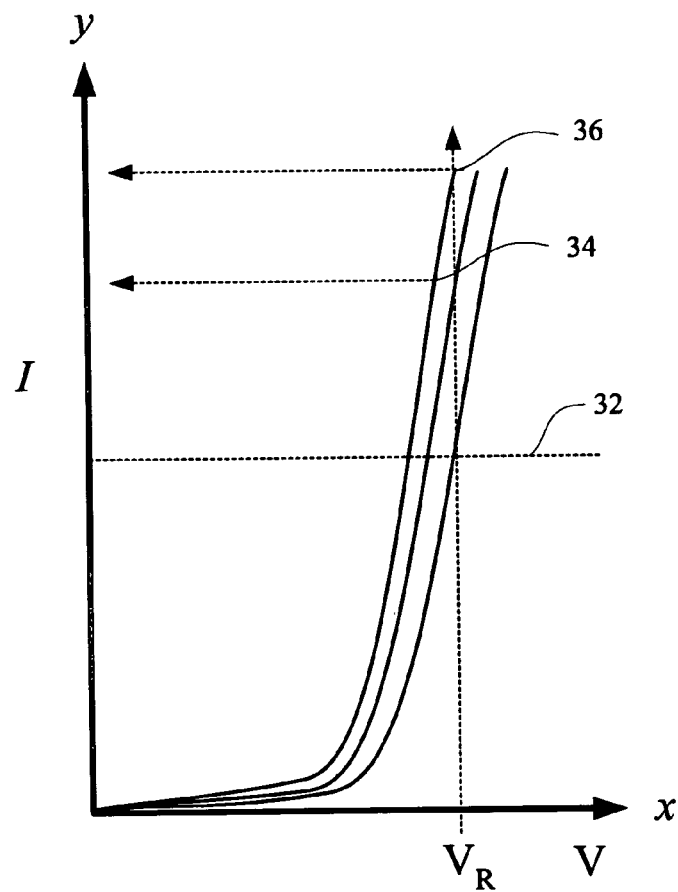
FIG. 3 is a graph illustrating current stresses experienced by the diodes due to small fluctuations in voltage during read operation.
Figure 4:
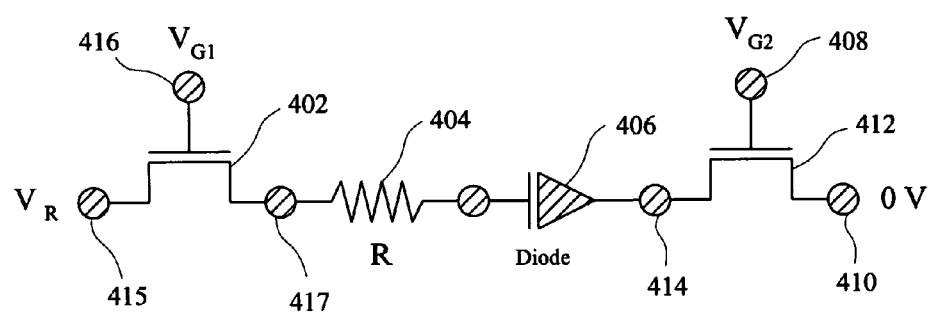
FIG. 4 is an equivalent circuit of a memory that employs layer decoder transistors at both the bit line and the word line in accordance with one embodiment of the invention.

FIG. 4 shows a simplified equivalent circuit of a word line and a bit line connected to decoder transistors in a memory structure. The decoder transistor is used to select the word line and bit line corresponding to a memory cell, to which a read and program operation is performed. The term program operation as used herein may also be referred to as a write operation. The circuit includes a first decoder transistor 402 and resistor 404. The resistor 404 represents the resistance of the word line and the bit line in the memory. The circuit further includes a diode 406 that controls the current to the bit line decoder transistor 408.

In one embodiment of the invention, a first voltage $V_{G1}$ is applied to the gate of the transistor 402. The voltage $V_{G1}$ is high enough to cause the resistance of the transistor to be low enough such that the transistor essentially functions as a switch. The transistor 402 is preferably a MOSFET. The voltage $V_{G1}$ ranges from about 5 Volts to about 10 Volts.

FIG. 4 further includes a diode 406, which controls the current to the bit line decoder transistor 408. A second voltage $V_{G2}$ is applied to the gate 412 of the bit line decoder transistor 408. The applied voltage $V_{G2}$ is in the moderate range from about 1 Volt to about 5 Volts. Moreover, the source voltage of the bit line decoder transistor 408 is maintained at about zero at the point 410. Application of a moderate voltage $V_{G2}$ combined with a low source voltage, cause the bit line decoder transistor 408 to act as a current limiter. It should be appreciated that this assists in retaining the overall current during read operation at about the saturation current of the bit line decoder transistor 408. As a result, the current remains substantially constant, thereby preventing current fluctuations during read and program operations.

Thus, the overall current during the read operation is substantially independent of the read voltage. The overall current during the read operation mostly depends on the gate voltage of the bit line decoder transistor 408. That is, the overall current is highly correlated to the gate voltage. As a result, the diodes will not experience any stress due to high current. This high correlation between the gate voltage and the over all current, also helps to alleviate the current variation resulting from the diode deviation and the loading effect. Moreover, in an embodiment of the present invention, the voltage at the source of the bit line 410 is maintained at zero so that the voltage between the drain and the source remains below the gate voltage, thereby preventing the bit line decoder transistor 408 from turning off.

Figure 5:
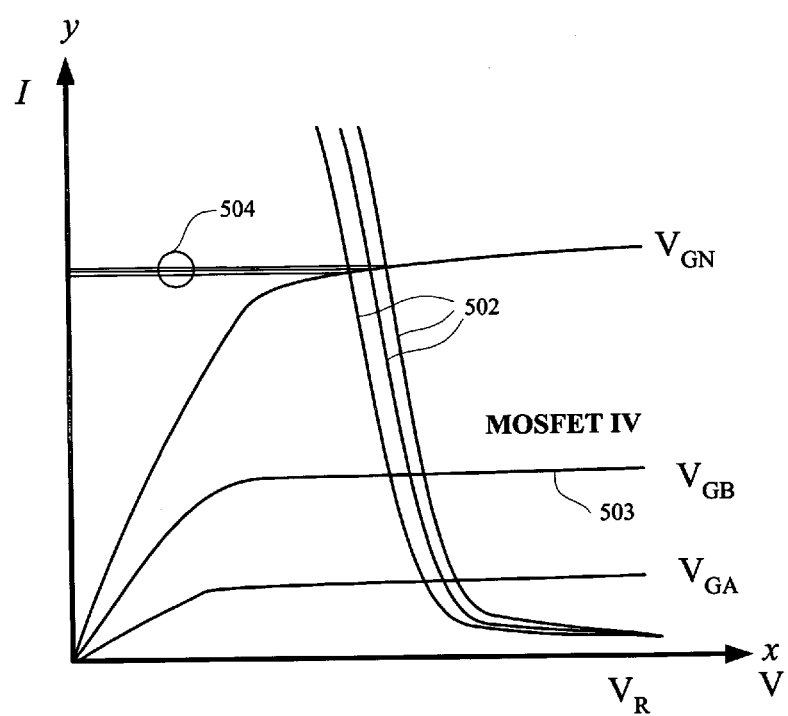
FIG. 5 is a graph illustrating the read current dependency on gate voltage instead of the read voltage in accordance with one embodiment of the invention.

FIG. 5, illustrates the load line analysis of the equivalent circuit utilizing the method illustrated in an embodiment of the present invention. In FIG. 5, the voltage during the read operation is represented on the x-axis and the current through the diode is represented on the y-axis. The lines 502 represent the current through the diodes (see FIG. 4) during the read operation. FIG. 5 shows that, by employing the present invention, the overall variation of the current in the diodes is relatively small as shown by the corresponding current values for lines 504.

The overall read current, I is substantially independent of diode characteristics and the read voltage $V_R$. According to an embodiment of the invention, the gate voltage VGA-VGN of the MOSFET, controls the read current. As can be seen, in FIG. 5, the current through the diodes does not depend on the read voltage $V_R$. Instead, the current depends on the gate voltage $V_{GA}$-$V_{GN}$.

Figure 6:
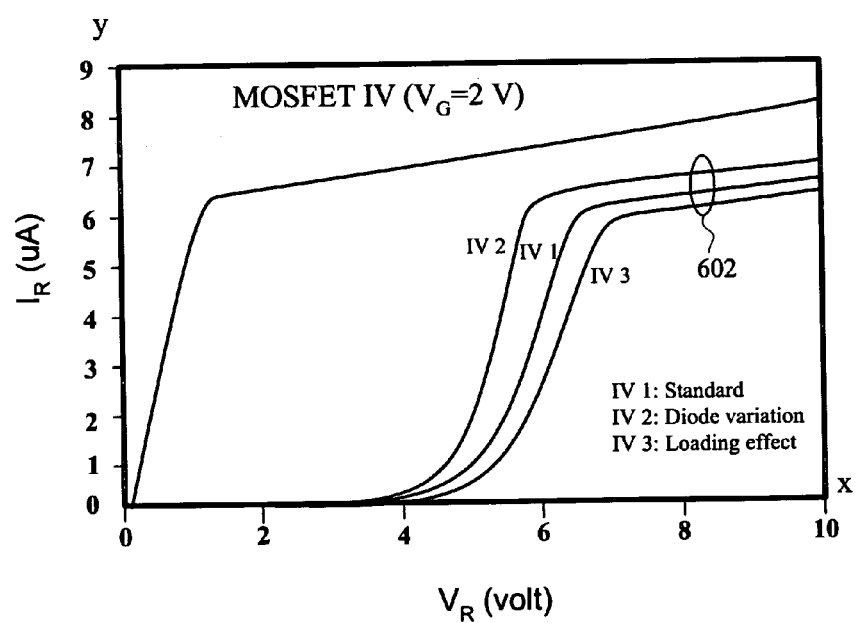
FIG. 6 is a graph illustrating minor fluctuations in current during read operation when a current limiter is used in accordance with one embodiment of the invention.

FIG. 6 further illustrates a small variation in the overall current during the read operation in accordance with an embodiment of the present invention. In FIG. 6, voltage $V_R$ during read operation is represented on the x-axis and current $I_R$ during the read operation is represented on the y-axis. FIG. 6 illustrates that the variation in current is minor as indicated by the difference in the corresponding current values associated with lines 602 when the bit line decoder transistor 408 of FIG. 4 acts as a current limiter in accordance with an embodiment of the invention.

In one embodiment of the invention, the memory structure is a multi-layer memory structure, for example a three dimensional memory structure. Moreover, the invention can be extended to other suitable 3D memory structures such as chalcogenide random access memory (CRAM).

Referring back to FIG. 4, another embodiment of the invention includes a method for limiting the overall current through a bit line decoder transistor 408, in a multi-layer memory structure, during a read operation. The method includes applying a moderate voltage $V_{G1}$ as described above, to the gate 408 of the transistor. The method further includes maintaining the source voltage of the bit line decoder transistor at about zero so that the voltage between the source 410 and the drain 414 of the bit line decoder transistor 412 is less than the gate voltage $V_{G2}$. This ensures that the bit line decoder transistor 412 will not be accidentally turned off. A third voltage is applied at the drain 415 of the word line decoder transistor and read the current from this node. The read current is largely dependent on the second voltage, and is essentially independent of the third voltage and the device variations. As can be seen, the word line decoder transistor is not suitable as a current limiter. This is because a read voltage is applied at the drain 415 of the word line transistor 402. If the word line transistor gate voltage $V_{G1}$ is smaller than the voltages of the source 417 and the drain 415, the effect will be to turn off the word line transistor 402.

The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

What is claimed is:

1. A method for controlling current fluctuations, during read and program operations in a memory matrix of programmable diodes, comprising:
    applying a first voltage to a first gate of a word line decoder transistor;
    applying a second voltage to a second gate of a bit line decoder transistor wherein the first voltage is greater than the second voltage;
    applying a third voltage to the drain of the word line decoder transistor; and
    maintaining a source voltage of the bit line decoder transistor at about zero.

2. The method for controlling current fluctuations of claim 1, wherein the word line decoder transistor is a metal oxide semiconductor field effect transistor (MOSFET).

3. The method for controlling current fluctuations of claim 2, wherein the bit line decoder transistor is a MOSFET.

4. The method for controlling current fluctuations of claim 1 further comprising:
    causing the word line decoder transistor to function as a switch.

5. The method for controlling current fluctuations of claim 1, wherein the method of operation of applying the first voltage to the first gate in the range from about 5 Volts to 10 Volts.

6. The method for controlling current fluctuations of claim 1, further comprising:
    causing the bit line decoder transistor to function as a current limiter.

7. The method for controlling current fluctuations of claim 1, wherein the method operation of applying the second voltage to the second gate in the range from about 1 Volt to about 5 Volts.

8. The method for controlling current fluctuations of claim 1, wherein the method of operation of applying a second voltage to a second gate of a bit line decoder transistor causes a current during the read operation to be constant.

9. The method for controlling current fluctuations of claim 8, wherein the current equals a saturation current of a MOSFET.

10. The method for limiting overall current during read and program operations of claim 9, further comprising:
    maintaining a source to drain voltage of the bit line decoder transistor lower than the voltage at the gate of the bit line decoder transistor.

11. A method for limiting overall current in a bit line decoder transistor during read and program operations in a memory matrix of programmable diodes, comprising:
    applying a voltage to a gate of the bit line decoder transistor; and
    applying a source voltage of about zero to the bit line decoder transistor such that a drain saturation current of the bit line decoder transistor, during the read and program operations, is constant.

12. The method for limiting overall current in a bit line decoder transistor during read and program operations of claim 11, wherein the bit line decoder transistor is a MOSFET.

13. The method for limiting overall current during read and program operations of claim 11, further comprising:
    applying a voltage to the gate from about 1 Volt to about 5 Volts.

14. The method for limiting overall current in a bit line decoder transistor during read and program operations of claim 11, further comprising:
    controlling the current during read and program operations by the voltage applied to the gate of the bit line decoder transistor.

* * * * *